United States Patent
Oshemkov et al.

(10) Patent No.: US 9,034,539 B2
(45) Date of Patent: May 19, 2015

(54) CONTROLLABLE TRANSMISSION AND PHASE COMPENSATION OF TRANSPARENT MATERIAL

(75) Inventors: Sergey Oshemkov, Karmiel (IL); Ralph Klaesges, Aalen (DE); Markus Mengel, Heidenheim (DE); Vladimir Kruglyakov, Haemek (IL); Eitan Zait, Tivon (IL); Vladimir Dmitriev, Karmiel (IL); Guy Ben-Zvi, Misgav (IL); Steven Labovitz, Sunnyvale, CA (US)

(73) Assignees: Carl Zeiss SMS GmbH, Jena (DE); Carl Zeiss SMT GmbH, Oberkochen (DE); Carl Zeiss SMS Ltd., Karmiel (IL)

( * ) Notice: Subject to any disclaimer, the term of this patent is extended or adjusted under 35 U.S.C. 154(b) by 216 days.

(21) Appl. No.: 13/806,252

(22) PCT Filed: Jun. 21, 2011

(86) PCT No.: PCT/US2011/041155
§ 371 (c)(1),
(2), (4) Date: Mar. 15, 2013

(87) PCT Pub. No.: WO2012/009108
PCT Pub. Date: Jan. 19, 2012

(65) Prior Publication Data
US 2013/0209926 A1    Aug. 15, 2013

Related U.S. Application Data

(60) Provisional application No. 61/539,334, filed on Jun. 28, 2010.

(51) Int. Cl.
C03C 15/00      (2006.01)
G03F 7/20       (2006.01)
C03C 23/00      (2006.01)

(52) U.S. Cl.
CPC .......... *G03F 7/2002* (2013.01); *C03C 23/0025* (2013.01)

(58) Field of Classification Search
CPC .... G03F 7/2002; C03C 15/00; C03C 23/0025
USPC ........................ 430/5, 33, 311, 321; 359/833; 219/121.69
See application file for complete search history.

(56) References Cited

U.S. PATENT DOCUMENTS 5,147,742 A    9/1992   Ban et al.
6,821,682 B1   11/2004  Stearns et al.
(Continued)

FOREIGN PATENT DOCUMENTS

DE    102006054820    11/2011
EP    2 175 310       4/2010
WO    WO03/022506     3/2003

OTHER PUBLICATIONS

International Search Report and Written Opinion dated Apr. 2, 2012 for corresponding application PCT/US2011/041155.
(Continued)

*Primary Examiner* — Stephen Rosasco
(74) *Attorney, Agent, or Firm* — Fish & Richardson P.C.

(57) ABSTRACT

A system for processing a substrate includes a light source to provide light pulses, a stage to support a substrate, optics to focus the light pulses onto the substrate, a scanner to scan the light pulses across the substrate, a computer to control properties of the light pulses and the scanning of the light pulses such that color centers are generated in various regions of the substrate, and at least one of (i) an ultraviolet light source to irradiate the substrate with ultraviolet light or (ii) a heater to heat the substrate after formation of the color centers to stabilize a transmittance spectrum of the substrate.

26 Claims, 15 Drawing Sheets

(56) References Cited

U.S. PATENT DOCUMENTS

| | | | |
|---|---|---|---|
| 6,844,272 | B2 | 1/2005 | Taylor et al. |
| 6,858,537 | B2 | 2/2005 | Brewer |
| 6,929,886 | B2 | 8/2005 | Zait et al. |
| 7,352,452 | B2 | 4/2008 | Wegmann et al. |
| 2003/0189031 | A1* | 10/2003 | Troitski et al. ............ 219/121.69 |
| 2004/0202968 | A1 | 10/2004 | Borrelli et al. |
| 2005/0068644 | A1* | 3/2005 | Ikuta et al. .................... 359/833 |
| 2006/0118703 | A1 | 6/2006 | Wegmann et al. |
| 2007/0065729 | A1 | 3/2007 | Zait et al. |
| 2007/0224522 | A1 | 9/2007 | Lee et al. |
| 2008/0203326 | A1 | 8/2008 | Neukirch |

OTHER PUBLICATIONS

Rothschild M. et al.: "Effects of Excimer Laser Irradiation on the Transmission, Index of Refraction, and Density of Ultraviolet Grade Fused Silica," Applied Physics Letters, AIP, American Institute of Physics, Melville, NY, US, vol. 55, No. 13, Sep. 25, 1989, pp. 1276-1278, XP000081967, ISSN: 0003-6951.

Hong-Bo Sun et al.: "Generation and Recombination of Defects in Vitreous Silica Induced by Irradiation with a Near-Infrared Femtosecond Laser", The Journal of Physical Chemistry B, vol. 104, No. 15, Apr. 1, 2000, pp. 3450-3455, XP55022467, ISSN: 1520-6106.

"Laser-induced color centers in silica," by L. Skuja, H. Hosono, M. Hirano, Proceedings of SPIE, vol. 4347, pp. 155-167 (2001).

"Color center generation in silicate glasses exposed in infrared femtosecond pulses," by O.M. Efimov, K. Gabel, S. V. Gernov, L. B. Glebev, S. Granthman,. Richardson, and M. J. Soioileau, J. Opt. Soc. Am., vol. 15, pp. 193-199 (1998).

Allen et al., "An ion figuring system for large optics fabrication", Proc. SPIE 1168, 33-50 (1989).

Ams et al., "Investigation of Ultrafast Laser-Photonic Material Interactions: Challenges for Directly Written Glass Photonics", IEEE Journal of selected topics in quantum electronics, vol. 14, No. 5, Sep./Oct. 2008 (1370).

Bechtold et al., "Non-thermal Micro Adjustment Using Ultrashort Laser Pulses", JLMN—Journal of Laser Micro/Nanoengineering vol. 2, No. 3, 2007.

Frost et al., "Large area smoothing of optical surfaces by low-energy ion beams," Thin Solid Films 459, 100-105 (2004).

Glezer et al., "3-D Optical Storage Inside Transparent Materials", Optics Letter, vol. 21, No. 24, pp. 2023-2025, 1996.

Hoskins, "Aspheric surface figuring of fused silica using plasma assisted chemical etching", SPIE vol. 2542, Optomechanical and Precision Instrument Design, pp. 220-230 (1995).

Jones, Ed., "Selected Papers on Computer Controlled Optical Surfacing", vol. MS40, SPIE Press, Bellingham, WA (1991).

Oshemkov et. al., "DUV attenuating structures in fused silica induced by ultrafast laser radiation", Proc. of CLEOE-IQEC-2007, Munich, 2007.

Shimotsuma et al., "Nano-modification inside transparent materials by femtosecond laser single beam", Modern Physics Letters B, vol. 19, No. 5 (2005) 225-238.

Shimotsuma et al., "Self-organized nanogratings in glass irradiated by ultrashort light pulses", Phys. Rev. Lett., vol. 91, No. 24, pp. 247405-1-247405-4, 2003.

Skuja et al., "Laser-induced color centers in silica", Proc. of SPIE, vol. 4347 (2001) 155-167.

Streltsov et al., "Fabrication and analysis of a directional coupler written in glass by nanojoule femtosecond laser pulses", Opt. Lett., vol. 26, No. 1, pp. 42-43, 2001.

Taylor et al., "Fabrication and Testing of Aspheres, Trends in Optics and Photonics (TOPS)", vol. XXIV, Optical Society of America, Washington, D.C. (1999).

Taylor et al., "Femtosecond laser erasing and rewriting of self-organized planar nanocracks in fused silica glass", Opt. Lett., vol. 32, No. 19, pp. 2888-2890, 2007.

Taylor et al., "Specification, Fabrication, Testing, and Mounting of EUVL Optical Substrates. In: EUV Lithography" (SPIE Press Monograph vol. PM178) Editor: Vivek Bakshi, 2008, 702 p.

Rainer Pforr et al "Performance comparison of techniques for intrafield CD control improvement" 2007.

"Notification Concerning Transmittal of International Preliminary Report on Patentability (Chapter I of the Patent Cooperation Treaty)", International Application No. PCT/US2011/041155, 9 pages, dated Jan. 10, 2013.

\* cited by examiner

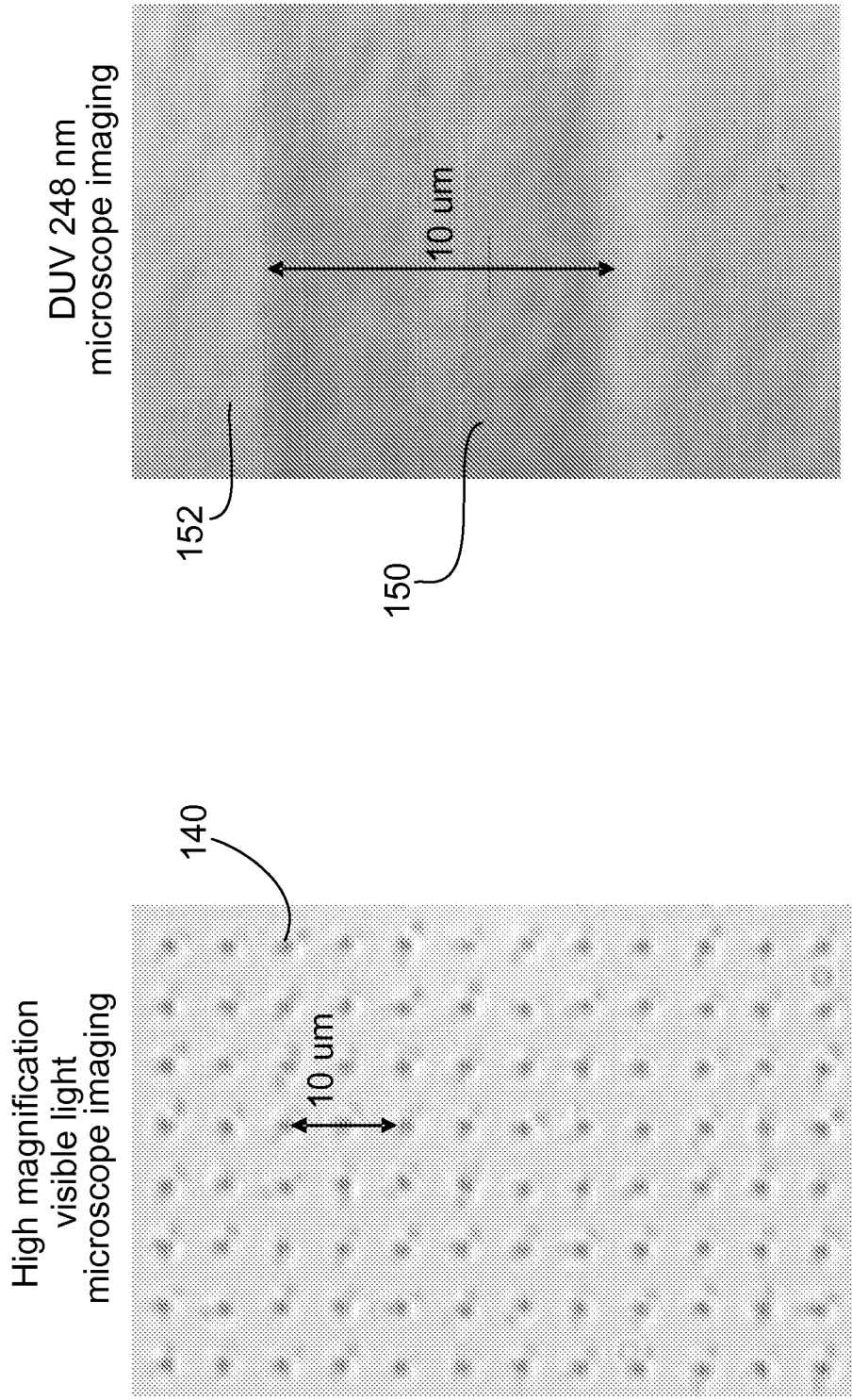

CONTROLLABLE TRANSMISSION AND PHASE COMPENSATION OF TRANSPARENT MATERIAL

CROSS-REFERENCE TO RELATED APPLICATIONS

This application is a national stage application of PCT/US2011/041155, filed on Jun. 21, 2011, which claims priority to U.S. Provisional Application 61/359,334, filed on Jun. 28, 2010, hereby incorporated by reference in its entirety.

TECHNICAL FIELD

This subject matter is generally related to controllable transmission and phase compensation of transparent material.

BACKGROUND

Integrated circuits can be printed on semiconductor wafers by exposure tools in a photolithography process by irradiance of, e.g., deep ultra-violet (DUV) radiation through photomasks. As design rules of the complementary metal oxide semiconductor (CMOS) technology printed features become smaller, the role of aberrations that lead to wave-front phase errors on exposure tools and optical imaging systems become more significant. Smaller resolvable features, such as lines and spaces or contact holes, can be achieved by light sources with shorter wavelength (e.g., DUV) radiation and by an increase in numerical aperture (NA) of the projection optics. Increasing the numerical aperture of the projection optics may result in higher sensitivity to aberrations and phase errors of the wave-front at the pupil planes of optical systems.

Optical tools manufacturers may measure each tool's imaging optics for their aberrations distribution, and a map of wave-front phase errors can be generated. Such maps of phase errors can also be measured and constructed for individual lenses and groups of lenses. The optical surfaces can be precision polished and some of the phase errors can be corrected based on the phase error maps.

SUMMARY

In general, in one aspect, a method for processing a substrate is provided. The method includes modifying a transmittance profile of a substrate with respect to a first radiation by focusing light pulses at various regions in the substrate to form color centers in the substrate, the regions being located inside the substrate and at a distance from a surface of the substrate, each of the light pulses having an energy level less than a breakdown threshold of a material of the substrate, the color centers enhancing absorption of the first radiation; and curing the substrate to stabilize a transmittance spectrum of the substrate.

Implementations of the method may include one or more of the following features. Curing the substrate can include irradiating the substrate with deep ultraviolet radiation. The deep ultraviolet radiation can have a wavelength in a range between 150 nm to 300 nm. Curing the substrate can include heating the substrate. The heating of the substrate can be in addition to the irradiation of the substrate with deep ultraviolet radiation. In some examples, the substrate can be heated at a temperature of at least 80° C. for a period of at least 0.1 hour. In some examples, the substrate can be heated at a temperature of at least 300° C. for a period of at least 1 hour. In some examples, the substrate can be heated at a temperature of at least 100° C. for a period of at least 10 hours. Heating the substrate can include local heating by focused electromagnetic radiation, in which the electromagnetic radiation has a wavelength selected such that the substrate is not fully transparent to the electromagnetic radiation and absorbs a portion of the electromagnetic radiation. The light pulses can include laser pulses. The laser pulses can include ultra-short laser pulses having a pulse width in a range from 10 femtoseconds to 100 picoseconds. The light pulses can be focused at multiple regions in the substrate by using a scanner to scan the light pulses across the substrate. The light pulses can be focused at multiple regions in the substrate by using a moving stage to move the substrate relative to the light pulses. The substrate can be made of fused silica. The substrate can be a photo mask, lens, or an optical plate. The focused light pulses can overlap such that the color centers overlap and form a continuous layer in the substrate. In some examples, the continuous layer can have a thickness less than 1000 µm. In some examples, the continuous layer can have a thickness less than 50 µm. The first radiation can include ultraviolet light. The substrate can be a photo mask having patterns designed to be illuminated by the first radiation to transfer the patterns to a wafer.

In general, in another aspect, a method for processing a substrate is provided. The method includes modifying a transmittance profile of a photo mask with respect to first ultraviolet light by focusing light pulses at various regions in the photo mask to form color centers in the photo mask, the regions being located inside the photo mask and at a distance from a surface of the photo mask, each of the light pulses having an energy level less than a breakdown threshold of a material of the photo mask, the color centers enhancing absorption of the first ultraviolet light; after formation of the color centers, irradiating the photo mask with second ultraviolet light to stabilize a transmittance spectrum of the photo mask; and heating the photo mask to stabilize the transmittance spectrum of the photo mask.

Implementations of the method may include one or more of the following features. In some examples, the photo mask can be heated at a temperature of at least 80° C. for a period of at least 0.1 hour. In some examples, the photo mask can be heated at a temperature of at least 300° C. for a period of at least 1 hour. In some examples, the photo mask can be heated at a temperature of at least 100° C. for a period of at least 10 hours. The second ultraviolet light can include deep ultraviolet radiation having a wavelength in a range from 150 nm to 300 nm. The light pulses can include laser pulses having pulse widths ranging from 10 femtoseconds to 100 picoseconds. The focused light pulses can overlap such that the color centers form a continuous layer in the photo mask. In some examples, the continuous layer can have a thickness less than 1000 µm. In some examples, the continuous layer can have a thickness less than 50 µm. The light pulses can be focused at multiple regions in the photo mask by using a scanner to scan laser pulses across the photo mask. The light pulses can be focused at multiple regions in the photo mask by using a moving stage to move the photo mask relative to the light pulses. In some examples, the first ultraviolet light can include deep ultraviolet light having a wavelength less than 300 nm. In some examples, the first ultraviolet light can include near ultraviolet light having a wavelength in a range from 300 nm to 400 nm. The first ultraviolet light can have a wavelength that is the same as or different from the wavelength of the second ultraviolet light.

In general, in another aspect, a method for modifying transmittance of a transparent medium is provided. The method includes identifying a phase error map for a transparent medium that specifies phase errors at various locations across the transparent medium; and modifying a transmission phase profile of the transparent medium according to the phase error map by focusing light pulses at various regions in the transparent medium to form regions having modified indices of refraction with respect to a first radiation. The light pulses also modify a density of the transparent medium at the regions to modify a surface height profile of the transparent medium, the light pulses being controlled such that a combination of the modification of refraction indices and the modification of the surface height profile compensate the phase errors specified by the phase error map.

Implementations of the method may include one or more of the following features. Each of some of the light pulses can have an energy level below a breakdown threshold of a material of the transparent medium, and regions having modified indices of refraction include color centers. The light pulses can include ultra-short laser pulses having pulse widths ranging from 10 femtoseconds to 100 picoseconds. The light pulses can be focused at multiple regions in the transparent medium by using a scanner to scan the light pulses across the substrate. The light pulses can be focused at multiple regions in the transparent medium by using a moving stage to move the transparent medium relative to the laser pulses. The density of a region of the transparent medium can be increased to form a valley on a surface of the transparent medium. Each of some of the light pulses can have an energy level above a breakdown threshold of a material of the transparent medium. The density of a region of the transparent medium can be decreased to form a bump on a surface of the transparent medium.

In general, in another aspect, a system for processing a substrate includes a light source to provide light pulses; a stage to support a substrate; optics to focus the light pulses onto the substrate; a scanner to scan the light pulses across the substrate; a computer to control properties of the light pulses and the scanning of the light pulses such that color centers are generated in various regions of the substrate; and at least one of (i) an ultraviolet light source to irradiate the substrate with ultraviolet light or (ii) a heater to heat the substrate after formation of the color centers to stabilize a transmittance spectrum of the substrate.

Implementations of the system may include one or more of the following features. The ultraviolet light source can provide deep ultraviolet light having a wavelength in a range between 150 nm to 300 nm. The system can include both the ultraviolet light source and the heater. The light source can include a laser source that provides laser pulses. The stage can include a moving stage that moves the substrate relative to the light pulses. The light source can include a laser source that provides ultra-short laser pulses having a pulse width in a range from 10 femtoseconds to 100 picoseconds. The system can include a storage device to store instructions that when executed by the computer cause the computer to control the heat source to heat the substrate at a temperature of at least 80° C. for a period of at least 0.1 hour. The system can include a storage device to store instructions that when executed by the computer cause the computer to control the heat source to heat the substrate at a temperature of at least 300° C. for a period of at least 1 hour. The system can include a storage device to store instructions that when executed by the computer cause the computer to control the heat source to heat the substrate at a temperature of at least 100° C. for a period of at least 10 hours. The heater can include an electromagnetic radiation source that provides electromagnetic radiation focused onto the substrate to heat the substrate, the electromagnetic radiation having a wavelength selected such that the substrate is not fully transparent to the electromagnetic radiation and the electromagnetic radiation is partially absorbed by the substrate. The system can include a storage device to store instructions that when executed by the computer cause the computer to control an energy level of the light pulse to be lower than a breakdown threshold of fused silica. The system can include a storage device to store instructions that when executed by the computer cause the computer to control at least one of an energy level, a repetition rate, a pulse duration, or a pitch of the light pulses such that the color centers achieve a target attenuation. The system can include a storage device to store instructions that when executed by the computer cause the computer to control a pitch of the light pulses in which the focused light pulses overlap such that the color centers form a continuous layer in the substrate. In some examples, the instructions when executed by the computer can cause the computer to control the light pulses such that the continuous layer has a thickness less than 1000 μm. In some examples, the instructions when executed by the computer can cause the computer to control the light pulses such that the continuous layer has a thickness less than 50 μm. The light source can include a variable attenuator that is controlled by the computer to control an intensity of the light pulses. The heater can include a baking oven having a baking chamber to receive the substrate.

In general, in another aspect, a system for modifying transmittance of a transparent medium includes a light source to provide light pulses; a stage to support a transparent medium; optics to focus the light pulses onto the transparent medium; and a computer to identify a phase error map that specifies phase errors at various locations across the transparent medium with respect to a first radiation, and control properties of the light pulses to form regions having modified indices of refraction with respect to a first radiation, the light pulses also modifying a density of the transparent medium at the regions to modify a surface height profile of the transparent medium. The light pulses are controlled such that a combination of the modification of refraction indices and the modification of the surface height profile compensates the phase errors specified by the phase error map.

Implementations of the system may include one or more of the following features. The system can include a storage device to store the phase error map. The system can include a storage device to store instructions that when executed by the computer cause the computer to control an energy level of the light pulses such that each of some of the light pulses has an energy level below a breakdown threshold of a material of the transparent medium, and the regions having modified indices of refraction include color centers. The system of any of claims 61 to 63 in which the light pulses include ultra-short laser pulses having pulse widths ranging from 10 femtoseconds to 100 picoseconds. The system can include a scanner to scan the light pulses across the transparent medium, and the computer can control the scanning of the light pulses in addition to the properties of the light pulses to control properties of the regions having modified indices of refraction. The stage can include a moving stage that moves the transparent medium relative to the laser pulses such that the laser pulses are focused at various regions of the transparent medium. The system can includes a storage device to store instructions that when executed by the computer cause the computer to control an energy level of the light pulses such that a density of the transparent medium at a region increases to form a valley on a surface of the transparent medium. The system can include a storage device to store instructions that when executed by the computer cause the computer to control an energy level of the light pulses such that each of some of the light pulses has an energy level above a breakdown threshold of a material of the transparent medium. The system can include a storage device to store instructions that when executed by the computer cause the computer to control an energy level of the light pulses such that a density of the transparent medium at a region increases to form a bump on a surface of the transparent medium.

DESCRIPTION OF DRAWINGS

FIG. 2 is an image showing pixels.

FIG. 3 is an image showing a region having overlapping color centers.

DETAILED DESCRIPTION

A system for controlling DUV transmission and phase compensation of a substrate is provided. The substrate can be, for example, a photo mask blank, lens, or optical wave plate. In some implementations, the DUV transmission profile across the substrate is controlled to meet a target profile. Laser pulses are focused at various regions in the body of the substrate to form regions of modified attenuation that enhance absorption (and attenuation) of DUV light. Each laser pulse has a power level below the breakdown threshold of the substrate material. By controlling the properties of the laser pulses (e.g., power level, pulse duration, pulse repetition rate, and pitch (distance between pulses)) applied to different regions, the amount of DUV attenuation achieved by the regions of modified attenuation can be varied, thereby controlling the DUV transmission in various regions across the substrate. After formation of the regions of modified attenuation, DUV light or heat, or both, are applied to the substrate to stabilize the transmission spectrum of the substrate.

In some implementations, the phase compensation across the substrate is controlled according to a phase error map. Laser pulses are focused at various regions in the body of the substrate to form regions of modified index of refraction in which the index of refraction and density are modified. The change in material density may result in surface deformation. Applying laser pulses in which each pulse has a power level above the breakdown threshold of the substrate material may result in an expansion of material and an increase in surface height. Applying laser pulses in which each pulse has a power level below the breakdown threshold of the substrate material may result in a compaction of material and reduction in surface height. The combination of the change in the index of refraction and the surface deformation causes DUV light passing the modified region to have a phase delay different from DUV light passing another region of the substrate that has not been modified. By controlling properties of the laser pulses applied to different regions, the amount of change in the index of refraction and the amount of surface deformation (either positive or negative) can be varied, thereby controlling the phase compensation in various regions across the substrate.

Although the examples described here are for controlling transmission and phase compensation of a transparent material with respect to DUV light, the same principles can be applied to light of other wavelengths, such as near ultraviolet light.

Figure 1:
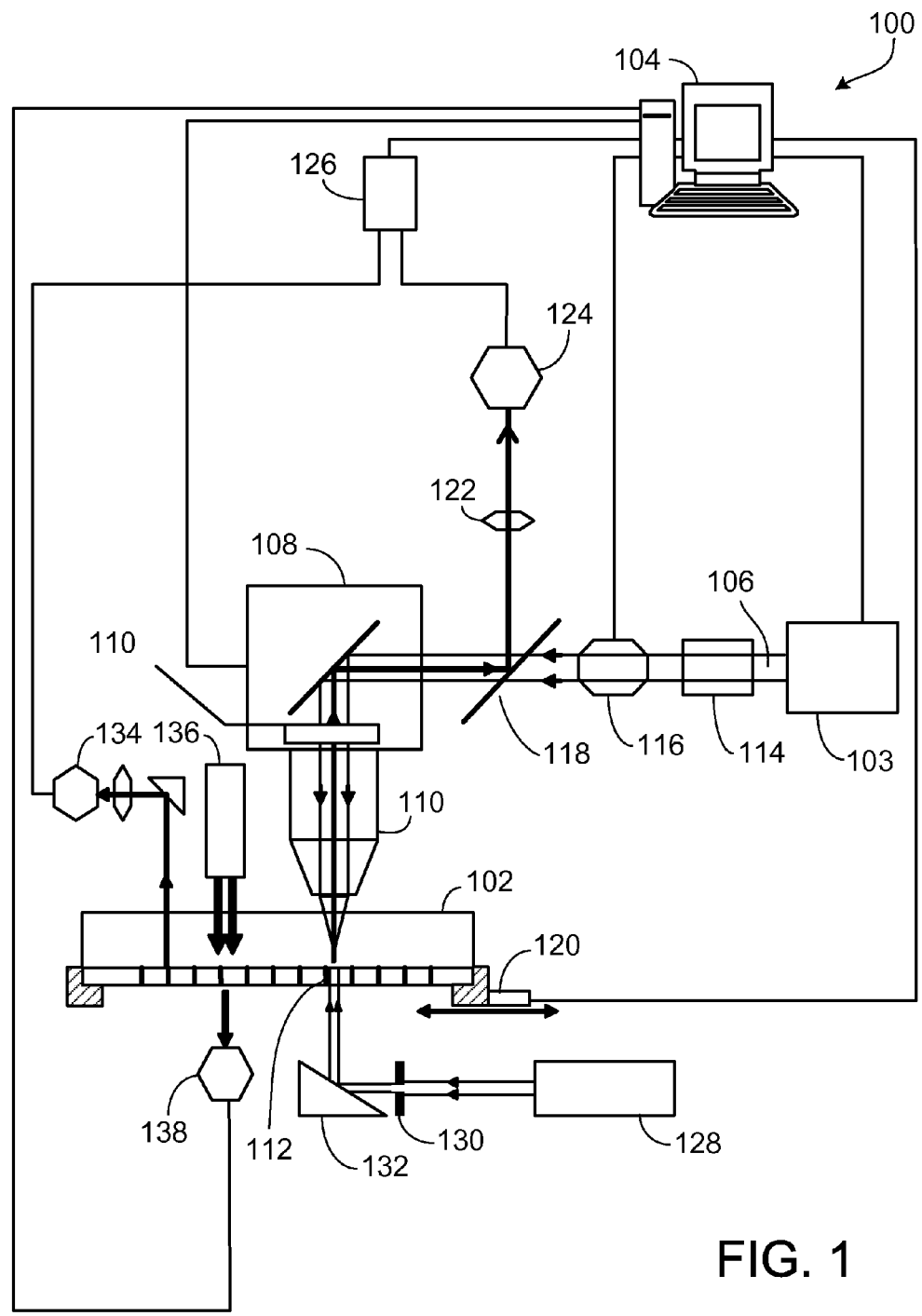
FIG. 1 is a diagram of an example system that can write a controlled amplitude and phase map inside a transparent substrate.

FIG. 1 shows an example system 100 that can write a controlled amplitude and phase map inside a transparent substrate 102. The substrate 102 can be made of, e.g., fused silica. A pulsed laser 103, controlled by a computer 104, emits a beam 106 towards a fast scanning sub-system 108, such as an acousto-optic deflector (AOD) or Galvo scanner, and into a high numerical aperture focusing objective 110. The laser beam 106 is focused inside the transparent substrate 102 to form pixels or color centers 112 inside the bulk of the substrate 102. The laser beam 106 (such as from Ti-Sapphire laser at a wavelength of 800 nm) can be frequency doubled or tripled (e.g., to 400 nm or 266 nm) by a high harmonic generator 114.

A variable attenuator 116 (which is controlled by the computer 104) controls the laser pulse energy. A rotating λ/2 wave plate 118 controls the laser beam writing polarization. The position of the substrate 102 relative to the focusing objective 110 is controlled by an XY moving stage 120 and a high magnification optical vision sub-system, which has the same optical axis and focusing objective 110 as the writing laser 103.

The high magnification vision sub-system includes a light source 128 with a dark-field aperture 130 to improve images of the pixels or regions having color centers. The light from the light source 128 is deflected by a mirror 132 to the objective 110. The high magnification image is separated from the laser track by the dichroic beam-splitter 118 and imaged via a tube-lens 122 onto a charge coupled device (CCD) camera 124. Images are collected by a frame-grabber 126 and sent to the computer 104. Coarse navigation is performed by a low magnification optical sub-system 134. The writing process is monitored by a detector 138 of a sensitive DUV transmission measurement sub-system 136.

The system 100 can write pixels and color centers in the substrate 102. As described in more detail below, the pixels are generated using laser pulses each having energy above breakdown threshold of the substrate material, and color centers are generated using laser pulses each having energy below the breakdown threshold.

FIG. 2 is a high magnification visible light microscopic image showing pixels 140 that are formed by applying laser pulses to a substrate in which each laser pulse has a level greater than the breakdown threshold of the substrate material. In optical breakdown, the substrate material is locally melted and microcracks are formed due to high local stress inducing local damage in the substrate. In this example, the pixels were written with a pitch of 5 μm. The individual pixels can be clearly seen in the image. The pixels can scatter light, reducing the amount of light transmitted through the substrate.

FIG. 3 is a microscopic image obtained using DUV 248 nm illumination, showing an example region 150 having color centers that are formed by applying laser pulses to a substrate in which each laser pulse has an energy level lower than the breakdown threshold of the substrate material. The region 150 appears darker than an adjacent region 152 that does not have color centers. The region 150 appears darker due to absorption of DUV light by the color centers. In this example, the pitch of the laser pulses is 0.1 μm, whereas the diameter of the laser beam in the focal point of the objective is 2.5 μm, so the laser pulses in the region 150 overlap significantly, forming a field of material continuously filled with color centers.

The laser-induced color centers can be formed by non-linear photoionization of the substrate material. Formation of color centers in fused silica and corresponding absorption spectra from DUV to near infrared range are described in "Laser-induced color centers in silica," by L. Skuja, H. Hosono, M. Hirano, Proceedings of SPIE, volume 4347, pages 155-167 (2001). A color center may have a transmission profile that is different from its surrounding region for light having a particular range of wavelengths, and may have a transmission profile that is the same as its surrounding region for light or radiation of other wavelengths or energy levels. Color centers do not necessarily have "colors" in the visible spectrum.

Figure 4:
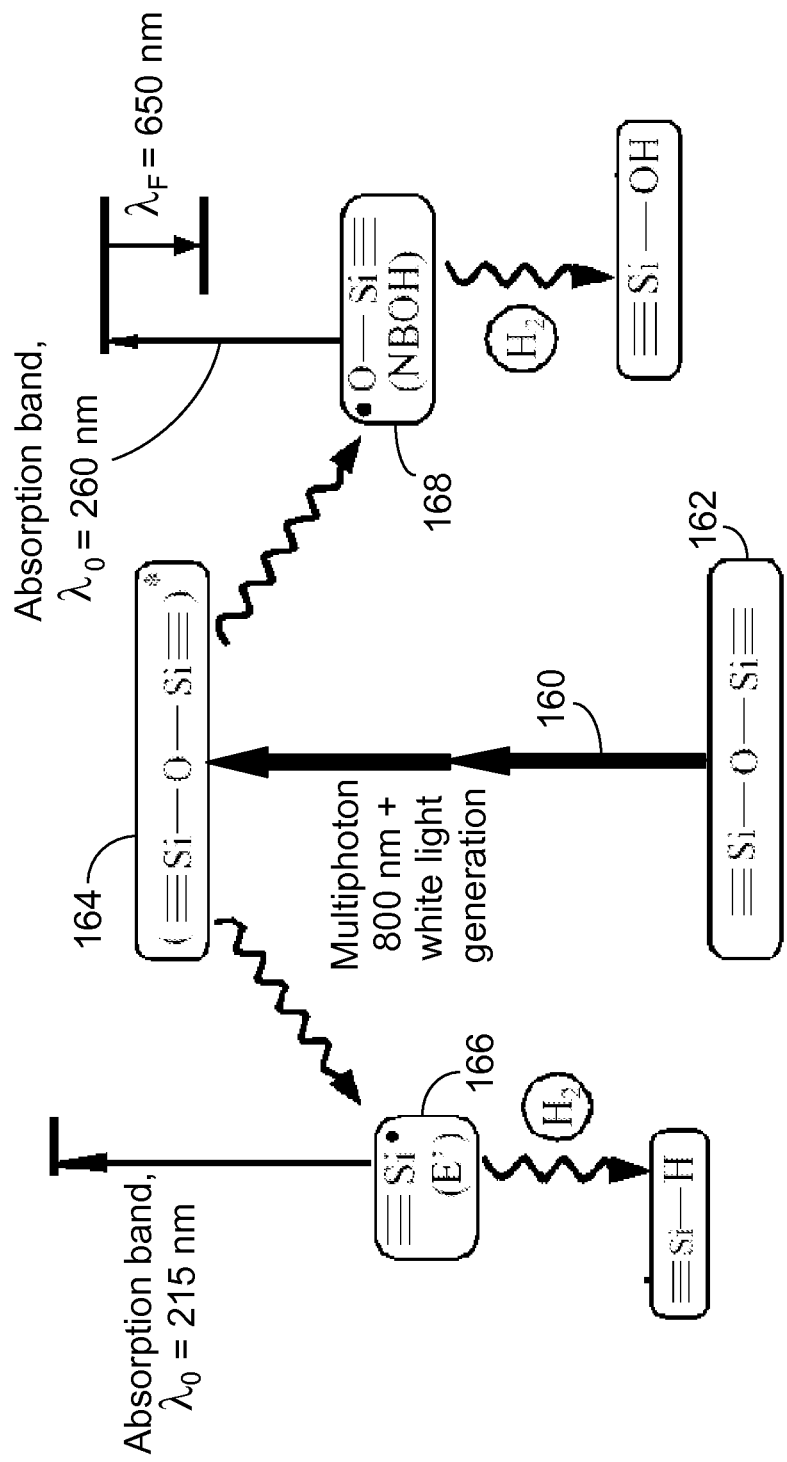
FIG. 4 is a diagram illustrating the processes at the generation of color centers in fused silica using a pulsed laser source.

FIG. 4 is a diagram illustrating the essential processes at the generation of color centers in fused silica using a pulsed laser source (e.g., laser 103 of FIG. 1). The bandgap energy 160 of fused silica between the valence band 162 and the conduction band 164 is about 9 eV. The wavelength of the laser source 103 is 800 nm (where frequency doubling is used), which corresponds to about 1.5 eV. A single photon of the pulsed laser source 103 cannot bridge the energy gap 160 between the valence band 162 and the conduction band 164. A single photon of the pulsed laser source 103 also cannot break up a bond between a silicon atom and an oxygen atom forming the structure of fused silica of the substrate 102.

The intensity in the focal point of the laser beam is, however, high enough so that non-linear photoionization processes may occur. One of several non-linear processes is multi-photon ionization, which occurs when a single electron in the valence band 162 of fused silica simultaneously absorbs several photons and thus bridging the gap 160 between the valence band 162 and the conduction band 164 of fused silica.

Another possible option includes self-focusing of the laser beam and spectral broadening of the high intensity laser pulse (white light generation), which leads to the increase of the single photon energy and increases the efficiency of the multi-photon ionization process. This is described in "Color center generation in silicate glasses exposed in infrared femtosecond pulses," by O. M. Efimov, K. Gabel, S. V. Gernov, L. B. Glebev, S. Granthman, Richardson, and M. J. Soioileau, J. Opt. Soc. Am., Vol. 15, pages 193-199 (1998).

In the focal point of an intense light pulse, a multitude of electrons are excited from the valence band 162 to the conduction band 164 of fused silica. The excited electrons in the conduction band 164 are also subject to the strong electric field of the laser pulses. The combined interaction of the electrons in the conduction band 164 and the intense electric field of the light pulses can break the bonding of an oxygen atom to one of the silicon atoms. If this occurs, two color centers 166, 168 are generated. In the E' center 166, a hole is trapped in an oxygen vacancy. In the non-bridging oxygen hole center (NBOHC) 168, an oxygen atom has an excessive electron. The excessive electron at the oxygen atom gives rise to strong absorption in the ultraviolet part of the spectrum. The absorption bands can be used to identify or detect the generated color centers.

In the presence of hydrogen and/or chlorine, both color centers 166 and 168 decay by forming a bonding with these elements. The time scale of this decay depends on the concentration of these and/or other impurities, the temperature, and the illumination conditions in particular the DUV (deep ultraviolet) radiation. At room temperature, the time constant can be in the range of ten days. It should be noted that in contrast to conditions of optical breakdown, the generation of color centers does not lead to microcracks in the substrate of photolithographic masks. It should further be noted that the generation of the color centers occurs below the threshold of breakdown, which results in a local mechanical damage of the substrate material.

The following describes controlling the transmission profile of the substrate 102 by forming color centers in the substrate 102.

Figure 5:
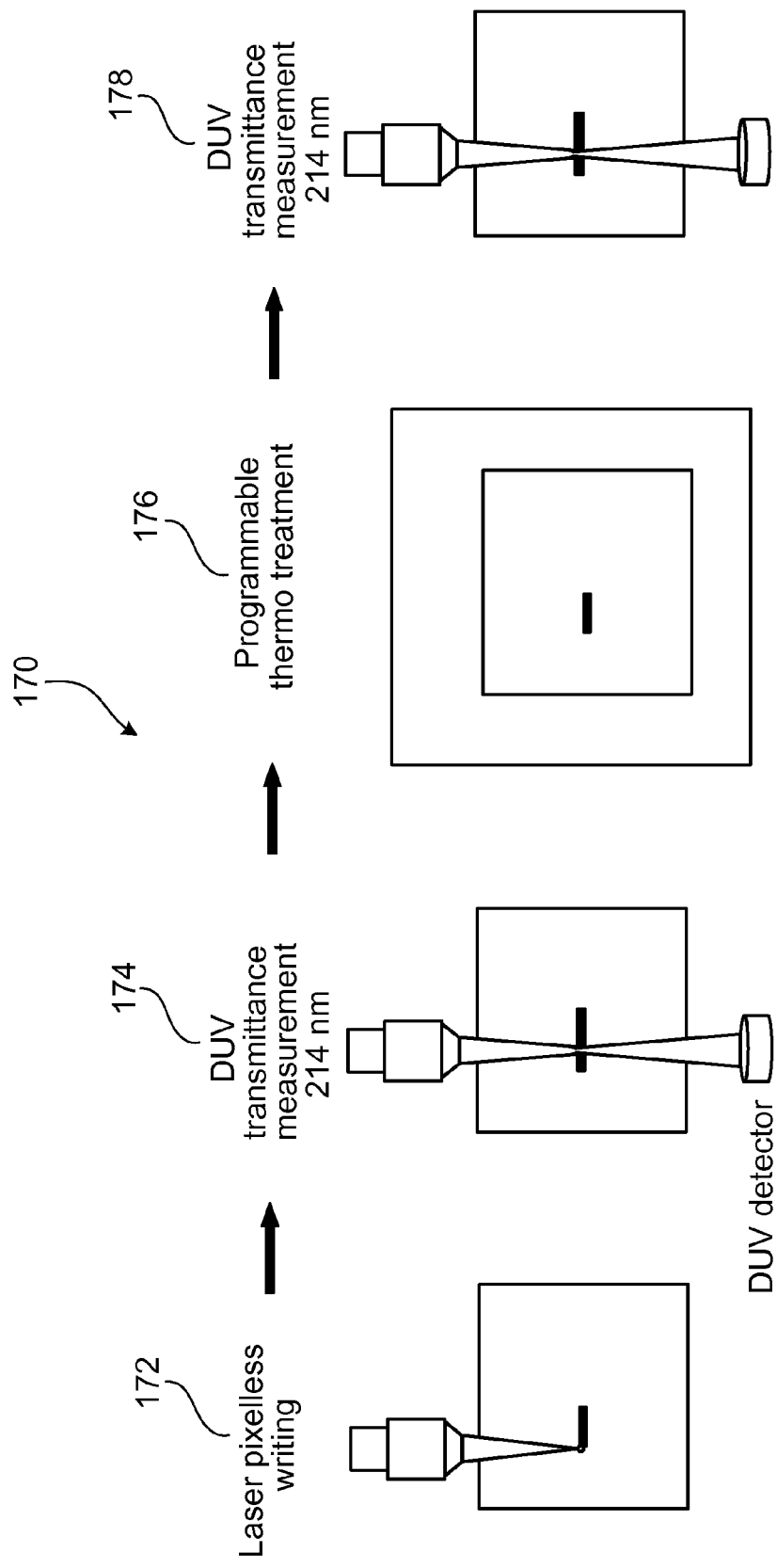
FIG. 5 is a diagram illustrating a process for modifying the transmission profile of a substrate by forming color centers.

FIG. 5 is a diagram illustrating a process 170 for modifying the transmission profile of the substrate 102 by forming color centers. Laser "pixel-less" writing is applied 172 to write color centers in the substrate 102. The phrase "pixel-less writing" refers to writing color centers using a small pitch in which laser pulses overlap, forming a continuous layer of modified material. A "pixel-less structure" refers to a region or structure formed by overlapped laser pulses and containing color centers, with no (or few) detectable internal structures that correspond to the locations where the laser pulses are applied.

For example, in FIG. 2 where pixel writing is used, pixels 140 can be detected at locations where laser pulses are applied. By comparison, in FIG. 3 where pixel-less writing is used, the pitch of the laser pulses is much less than the diameter of the laser beam in the focal plane of the objective so that the color centers overlap, such that the entire region 150 has a transmission profile that is different from other regions, but within the region 150 there is no discernible pattern indicating where the laser pulses are applied. There may be slight variations in the absorption or transmission spectrum within the pixel-less structure due to, for example, non-uniformity in the substrate material, the energy of the laser pulses, or the duration of the laser pulses.

In some examples, the laser pulses are applied to a substrate that has patterns having bright and dark regions, in which the laser pulses modify the transmittance of portions of the bright or dark regions of the patterns.

In some implementations, the computer 104 controls the pixel-less writing according to a transmission correction map. For example, the substrate 102 may be examined to determine whether its transmission profile is uniform, and deviations from an average or nominal transmission value are detected and compiled to form a transmission error map. In some examples, the substrate is a photo mask having circuit patterns, and the transmission correction map is designed to improve critical dimension uniformity of features printed on a wafer based on the patterns on the photo mask. The computer 104 includes a storage device to store the transmission correction map or error map.

The computer 104 converts the transmission correction map (or error map) into a laser writing map, which specifies parameters of laser pulses (e.g., power level, pulse duration, pulse repetition rate, pitch) at various locations in order to write color centers having the desired DUV attenuation level. The laser writing map can be stored in the storage device for later retrieval.

After the color centers are formed, the color centers of the substrate 102 are illuminated with DUV light, and DUV transmittance is measured. For example, 214 nm light can be used for the DUV treatment. Illuminating the color centers with DUV light helps stabilize the transmission spectrum of the substrate 102. In some examples, the DUV treatment may not be sufficient to fully stabilize the transmission spectrum of the substrate 102.

A programmable thermal treatment can be applied 176 to the substrate 102 to stabilize the transmission spectrum of the substrate 102. The temperature and duration of the thermal treatment may depend on various parameters, such as the material used for the substrate and the characteristics of the color centers. After the thermo treatment, DUV transmittance measurement is performed 178 on the substrate 102 to measure the final transmission spectrum and verify that the transmission spectrum has stabilized.

Using the pixel-less structures can have several advantages. For example, the absorption spectra of a substrate can be modified without changing the scattering proprieties of the substrate. This avoids undesired effects, such as scattered light. Using pixel-less structures also makes it possible to control phase distribution due to modification of both the volume and surface height of the material.

Figure 6:
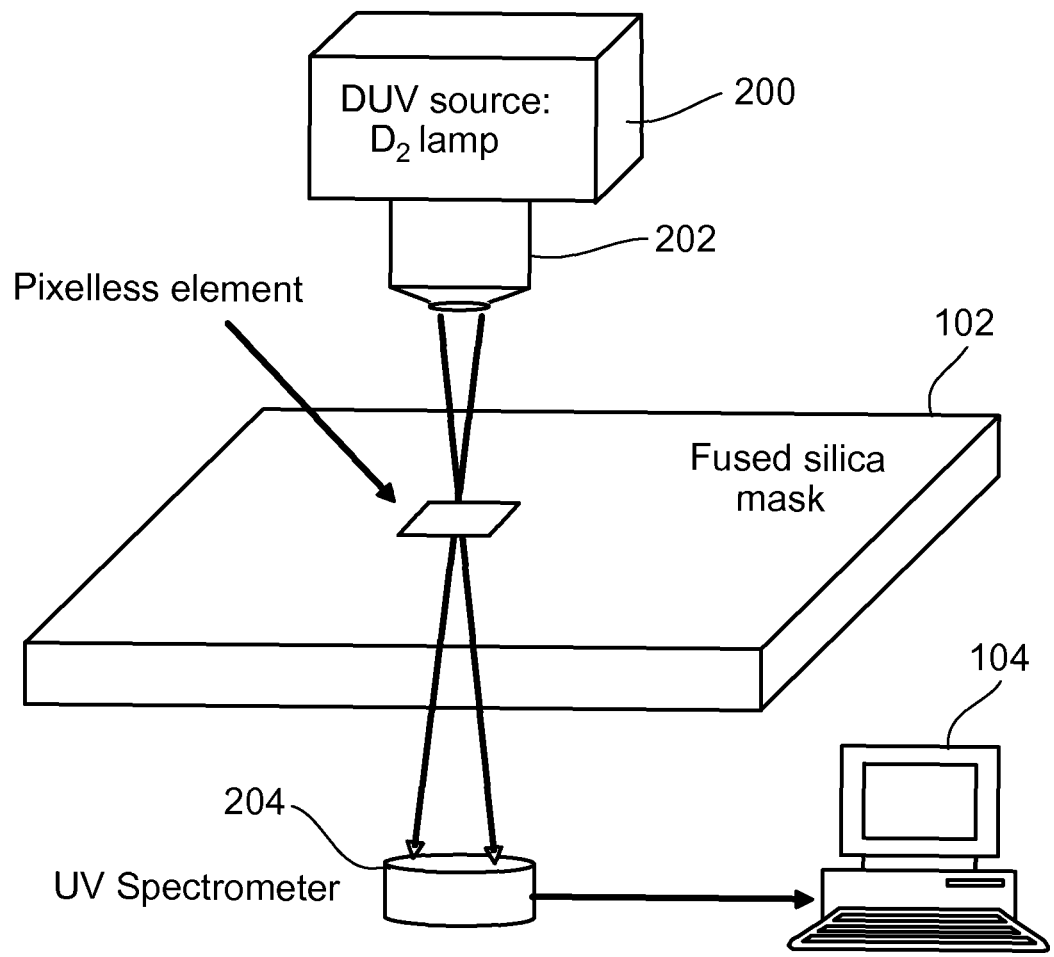
FIG. 6 is a diagram of an example setup for applying DUV treatment to a substrate.
Figure 7:
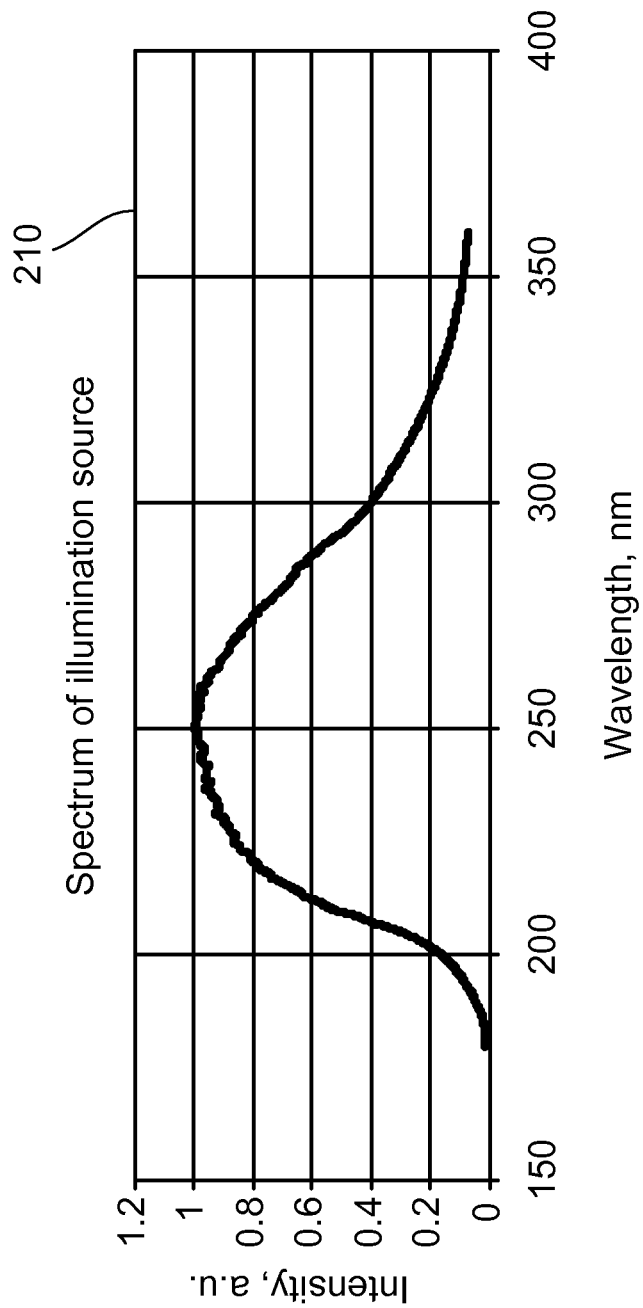
FIG. 7 is a graph of a deuterium lamp light spectrum.

FIG. 6 is a diagram of an example setup for applying DUV treatment to the substrate 102. A DUV source 200, such as a deuterium lamp having a spectrum shown in FIG. 7, can be used to provide DUV light that is focused by an objective lens 202 onto the color centers in the substrate 102. A UV spectrometer 204 measures the UV transmission spectrum, and the measurement data is sent to the computer 104.

The following describes examples of applying DUV and thermal treatment to a mask after formation of color centers.

Figure 8:
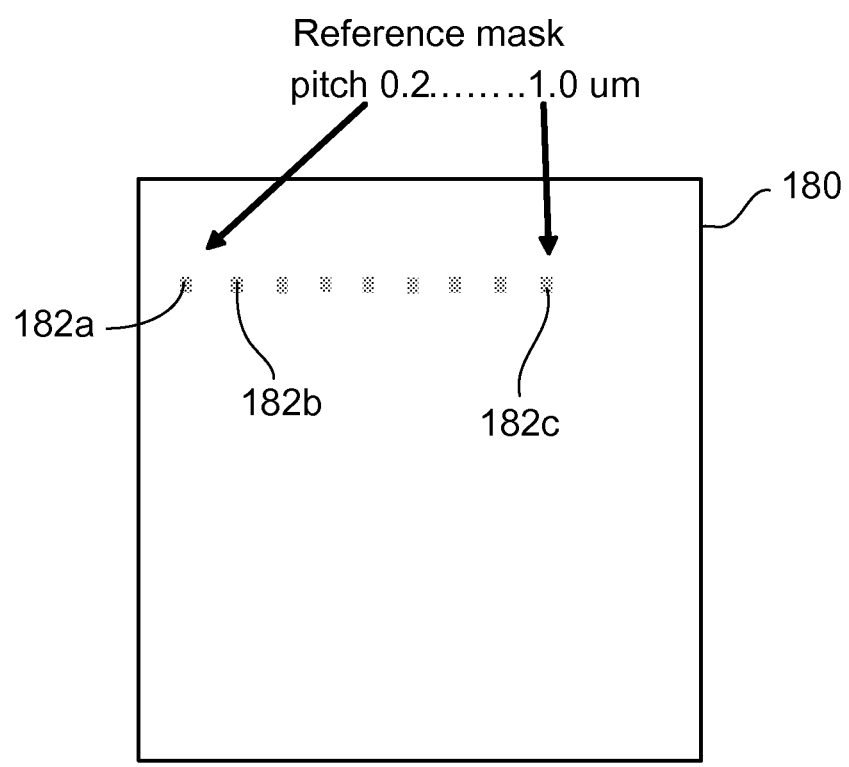
FIG. 8 is a diagram of a reference mask having a row of cells in which color centers are written into the cells.

FIG. 8 is a diagram of a reference mask 180 in which color centers are written into nine cells 182a, 182b, . . . , 182c, with a pitch of 0.2 µm, 0.3 µm, . . . , 1 µm. Each of the cells 182a to 182c has an area of several square millimeters.

Figure 9:
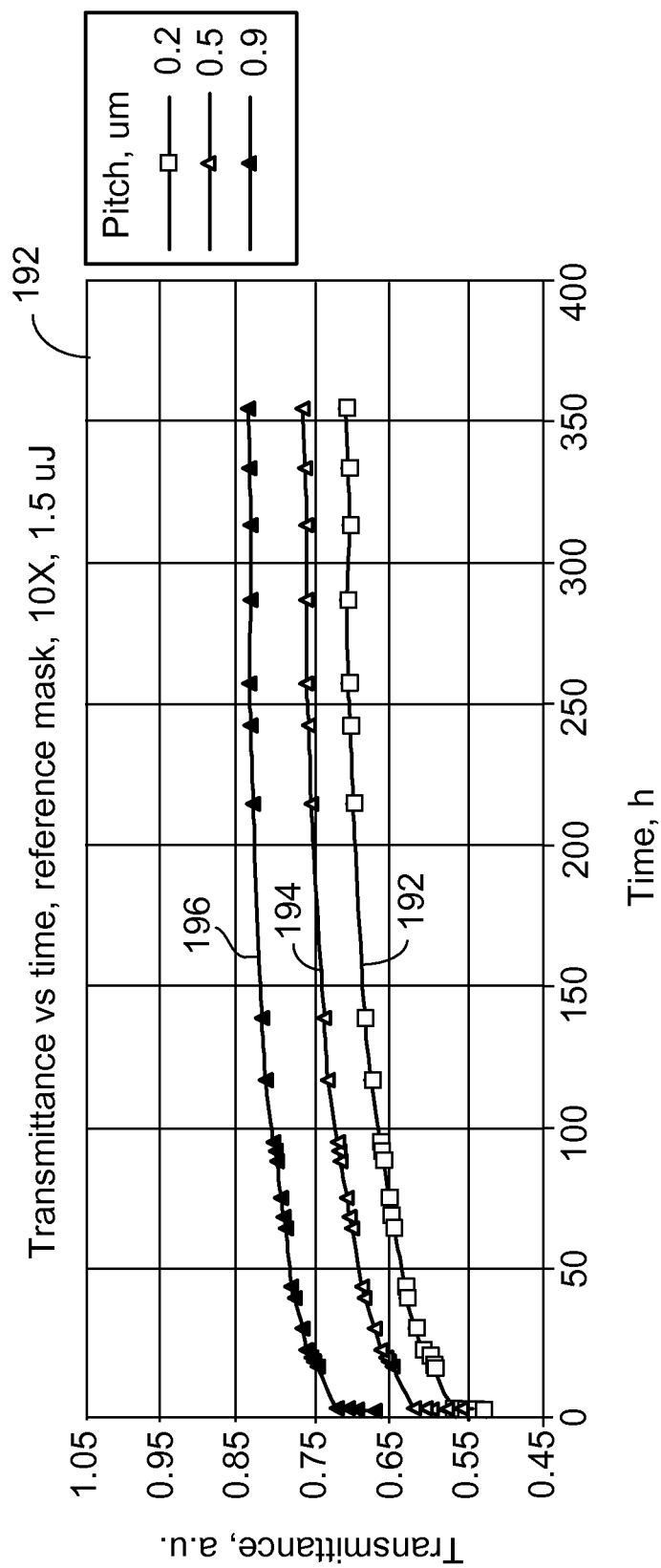
FIG. 9 is a graph having curves representing the transmittance versus time relationship for the cells in FIG. 8.

FIG. 9 is a graph 190 having curves 192, 194, and 196 representing the transmittance versus time relationship for the cells (in the reference mask 180) with color centers having a pitch of 0.2 µm, 0.5 µm, and 0.9 µm, respectively. The graph 190 shows that fast bleaching (changing of transmittance over time) occurred during the first 10 hours or so after writing the color centers, the bleaching slowed after 10 hours, and the transmission stabilized at about 250 hours.

As shown in FIG. 9, the smaller the pitch between laser pulses, the lower the transmittance. This is because the denser the color centers, the greater the absorption by the color centers, hence the lower the transmittance.

Figure 10:
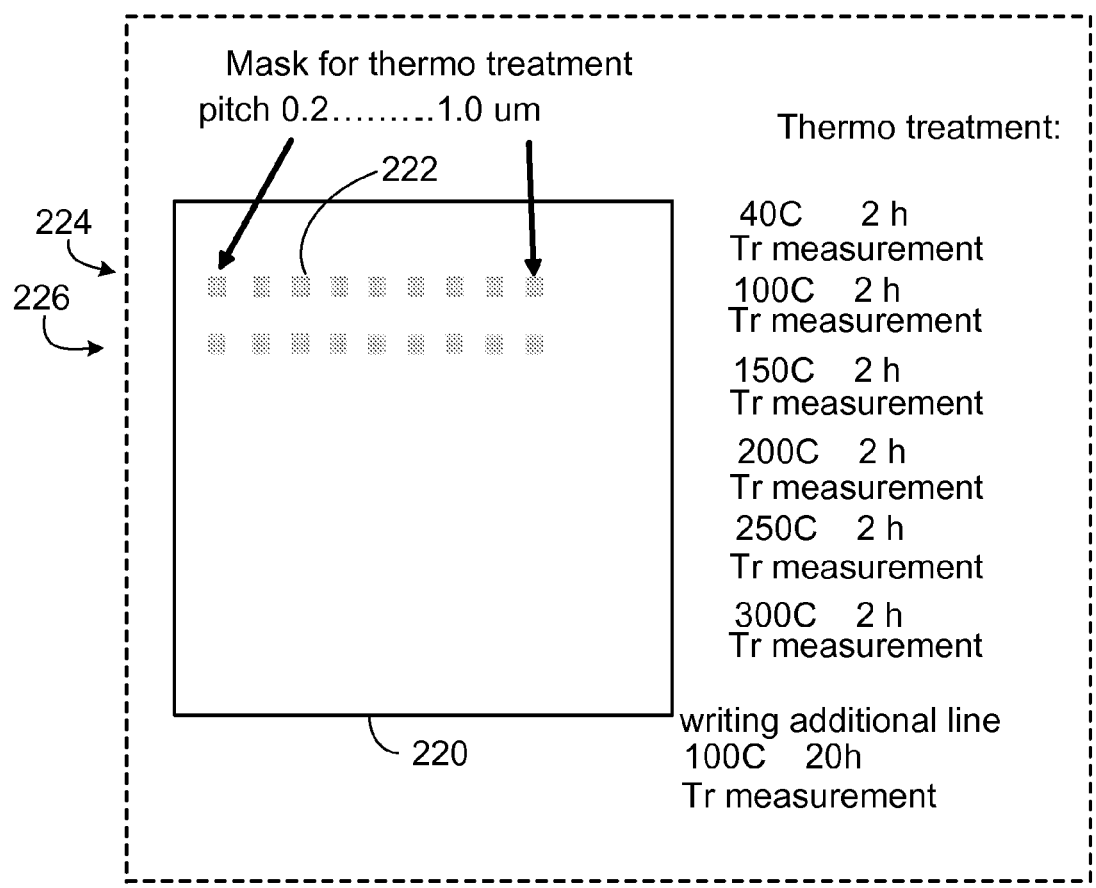
FIG. 10 is a diagram of a test mask in which color centers were written into cells.

FIG. 10 is a diagram of a test mask 220 in which color centers were written into cells 222. Color centers were formed in a first row of cells 224, and at various times during a 150 hour period, the mask 220 was subject to thermal treatment at various temperatures (e.g., 40° C., 100° C., 150° C., 200° C., 250° C., and 300° C.) for two hours each, and the transmission of DUV at the cells 224 were measured. At the 152$^{th}$ hour, color centers were formed in a second row of cells 226, and the mask 220 was heated to 100° C. for 20 hours.

Figure 11:
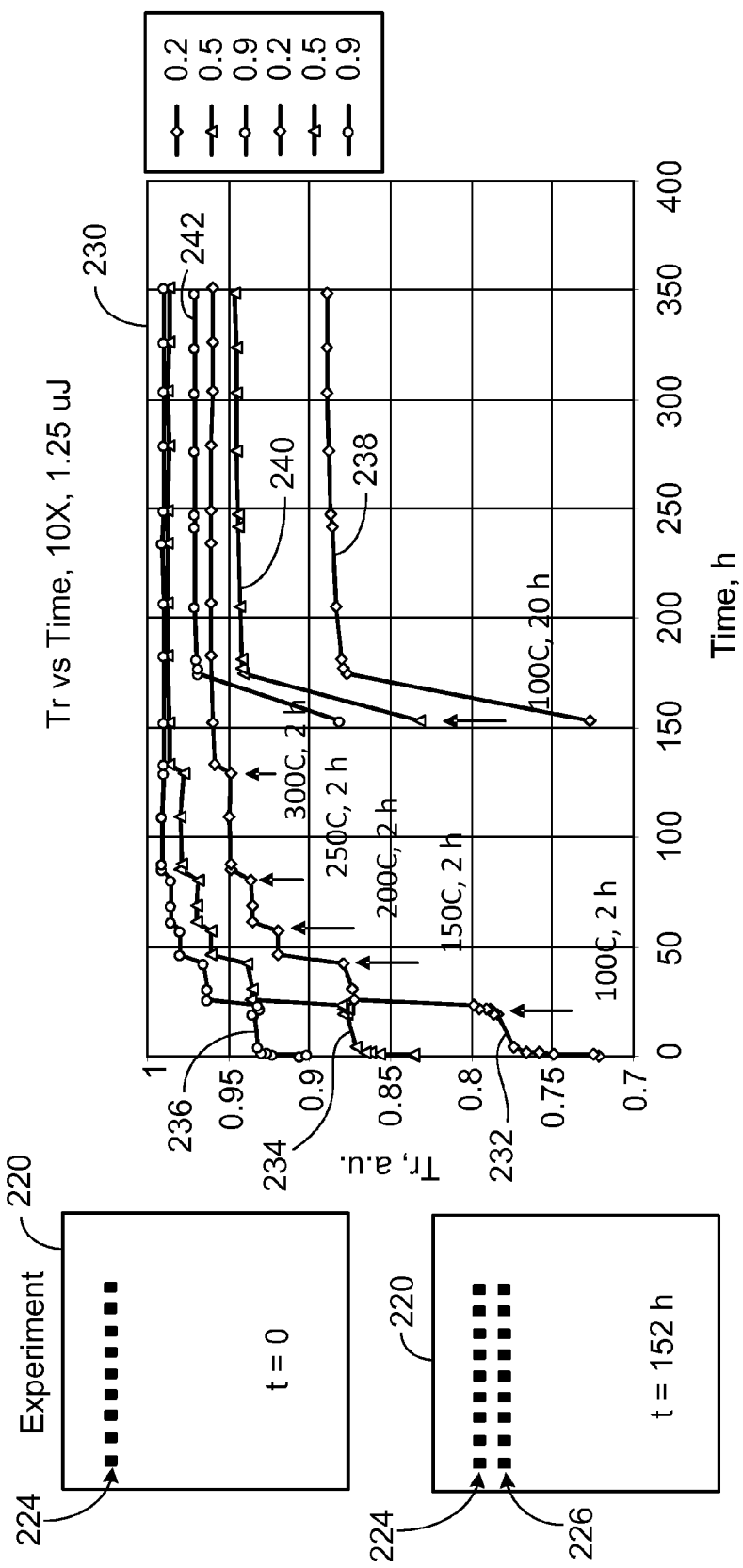
FIG. 11 is a graph having curves representing the transmission versus time relationship for the cells in FIG. 10.

FIG. 11 shows a graph 230 having curves 232, 234, and 236 representing the transmission versus time relationship for cells (in the test mask 220) with laser pulses having a pitch of 0.2 µm, 0.5 µm, and 0.9 µm, respectively. The curves 232, 234, and 236 indicate that the transmission profile stabilized after about 150 hours, in which at various times the test mask 220 was subject to thermal treatment at 40° C. for 2 hours, 100° C. for 2 hours, 150° C. for 2 hours, 200° C. for 2 hours, 250° C. for 2 hours, and 300° C. for 2 hours.

Curves 238, 240, and 242 indicate that the transmission profiles of the second line of regions 226 were substantially stabilized after thermal treatment at 100° C. for 20 hours.

Figure 12:
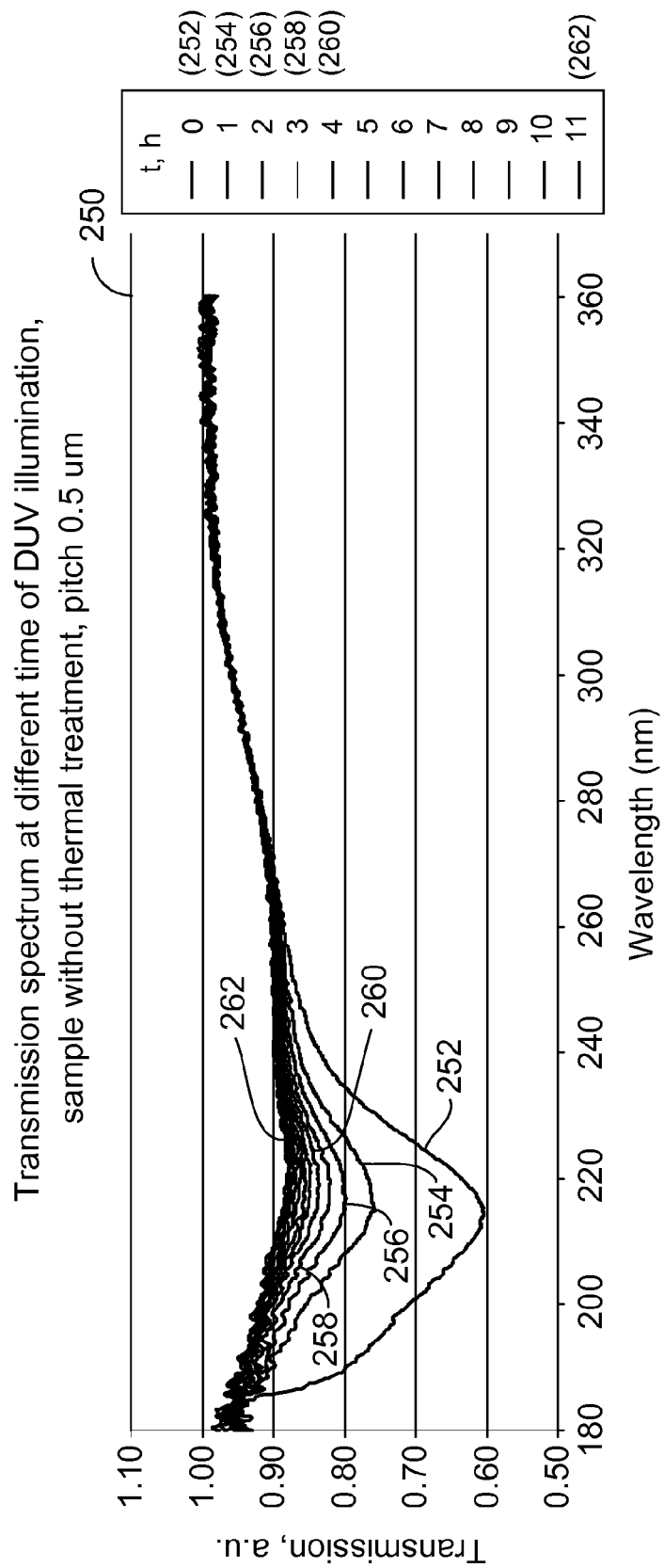
FIG. 12 is a graph having curves that represent the transmission spectrum at different times for the cell having laser pulses with 0.5 µm pitch, in which thermal treatment was not applied.

FIG. 12 is a graph 250 having curves 252, 254, 256, 258, 260, . . . , 262 that represent the transmission spectrum at time t=0, t=1 hour, t=2 hours, t=3 hours, t=4 hours, . . . , t=11 hours, respectively, for the cell having laser pulses with 0.5 µm pitch, in which thermal treatment was not applied. The graph 250 shows that, for the absorption band $\lambda_0$~215 nm (associated with E' centers) of the color centers, there is a significant change in transmission during the first 11 hours after the color centers are formed. The change in transmission for the absorption band $\lambda_0$~260 nm (associated with NBOH) is less significant.

Figure 13:
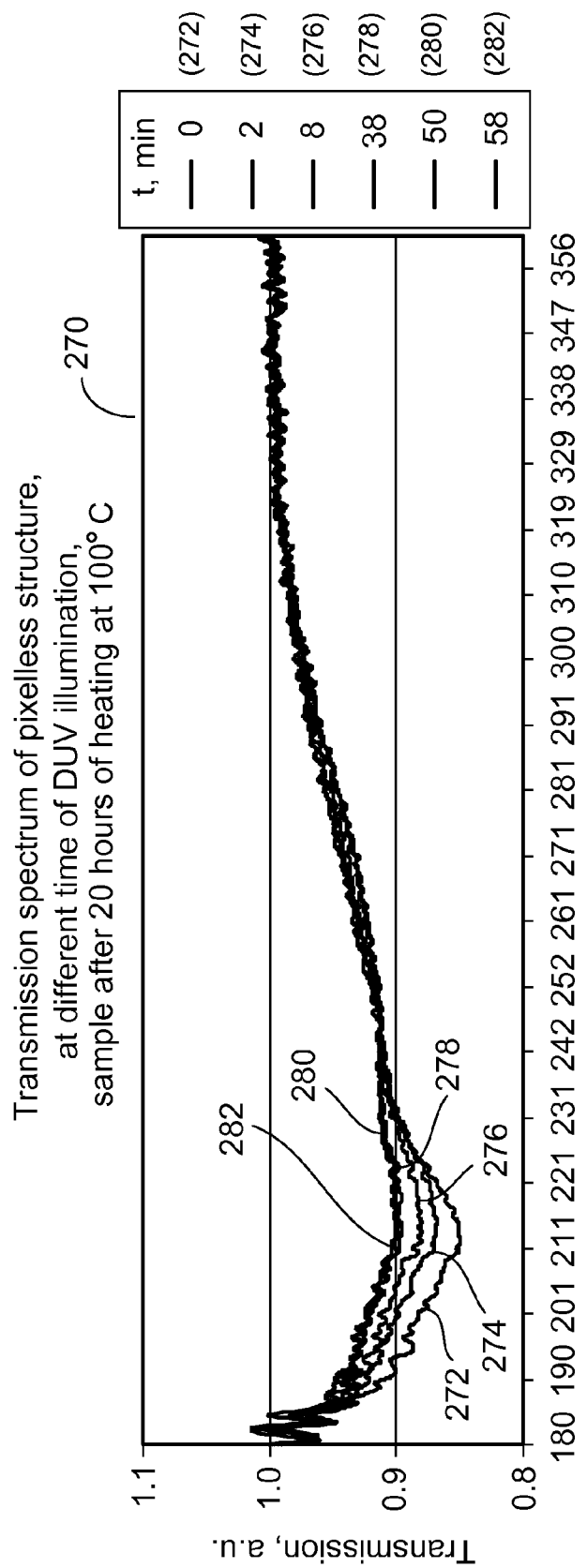
FIG. 13 is a graph showing the transmission spectrum of a cell having a pixel-less structure containing color centers, in which both thermal treatment and DUV illumination were applied.

FIG. 13 is a graph 270 showing the transmission spectrum of a cell having a pixel-less structure containing color centers, in which both thermal treatment and DUV illumination were applied. Curves 272, 274, 276, 278, 280, and 282 represent the evolution of transmission spectrum of the cell after thermal treatment of 20 hours at 100° C. followed by DUV illumination, in which the DUV illumination time periods were 0, 2 minutes, 7 minutes, 38 minutes, 50 minutes, and 58 minutes, respectively. The graph 270 shows that after thermal treatment of 20 hours at 100° C., only 50 minutes of DUV illumination was sufficient to stabilize the transmission spectrum of the pixel-less structure.

Figure 14:
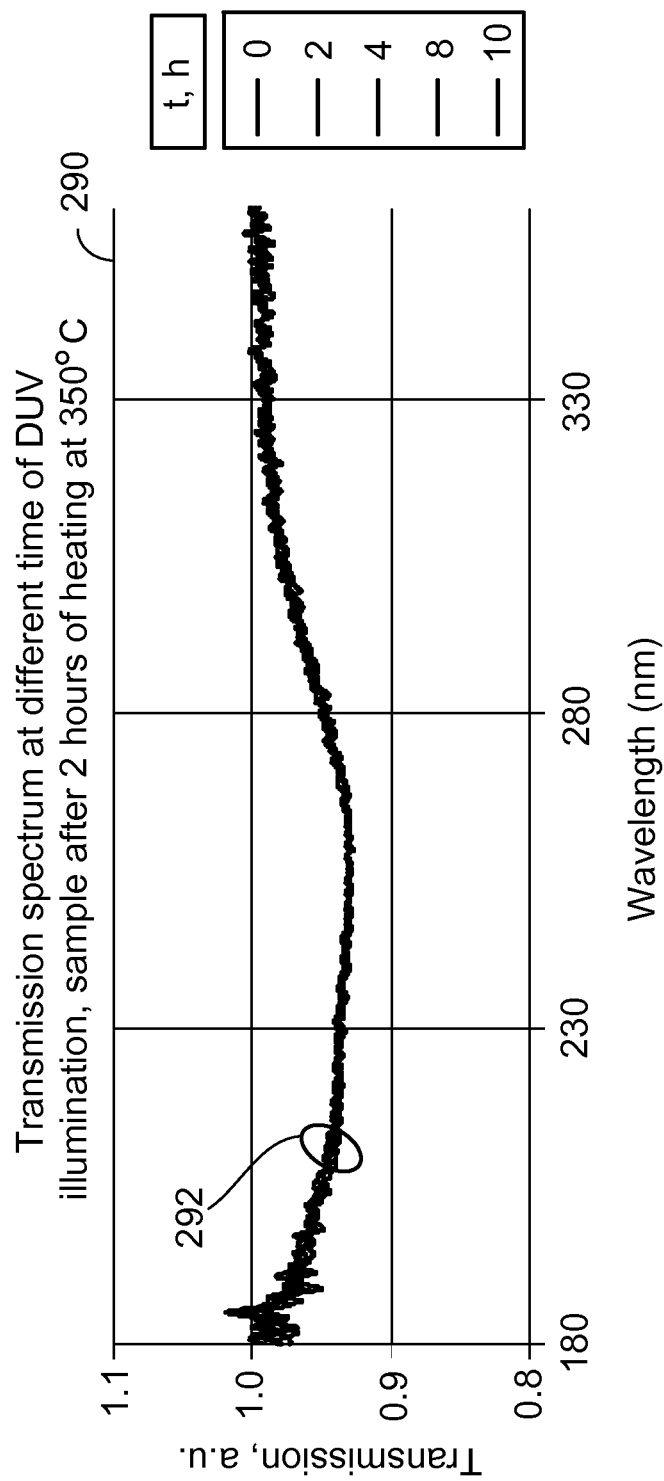
FIG. 14 is a graph showing the transmission spectrum of a cell having a pixel-less structure containing color centers, in which both thermal treatment and DUV illumination were applied.

FIG. 14 is a graph 290 showing the transmission spectrum of a cell having a pixel-less structure containing color centers, in which both thermal treatment and DUV illumination were applied. The mask with processed cell was heated to 350° C. for 2 hours and after that was subject to DUV illumination. The measurements of transmission spectrum were performed after the DUV illumination time periods of 0, 2 hours, 4 hours, 8 hours, and 10 hours. The curves 292 are substantially close to one another, indicating that after heating to 350° C. for 2 hours, the transmission spectrum of the processed cell does not change even after applying DUV illumination. This shows that a thermal treatment of 2 hours at 350° C. was sufficient to stabilize the transmission spectrum of the pixel-less structure.

The following describes using formation of color centers and surface deformation to control phase compensation across the substrate 102.

Figure 15:
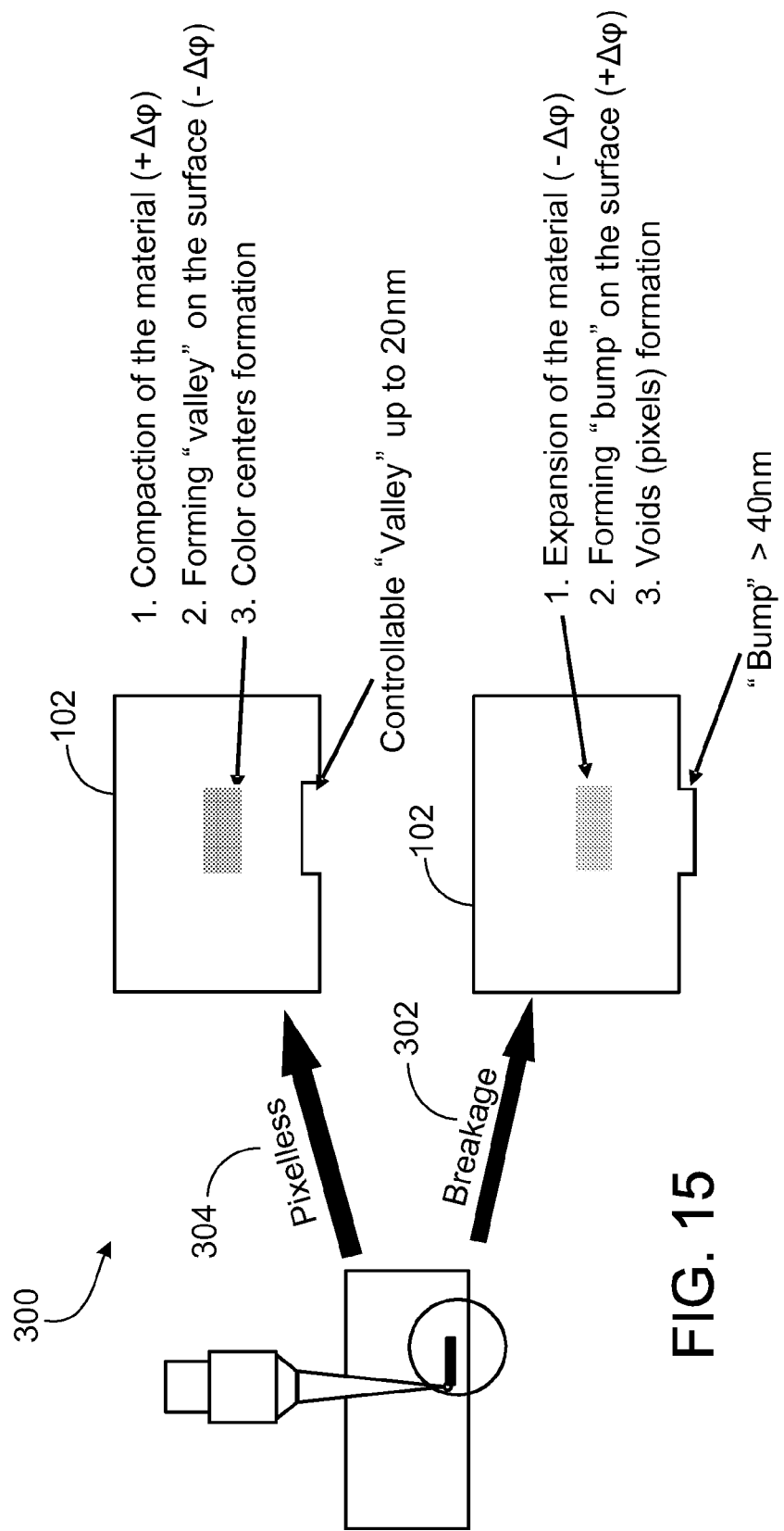
FIG. 15 is a diagram showing two ways of forming a region of modified index of refraction: by breakage or pixel-less writing.

Referring to FIG. 15, a diagram 300 shows two ways of forming a region of modified index of refraction: by breakage 302 or by pixel-less writing 304. Applying laser pulses above the breakdown threshold results in formation of pixels, expansion of the substrate material, decrease in the index of refraction, and formation of a "bump" on the substrate surface. Expansion of the substrate material produces a negative phase change, while formation of the bump produces a positive phase change. For some substrates, such as substrates made of fused silica, the overall effect from the expansion of the substrate material and the formation of the bump results in a net negative phase change.

Applying laser pulses below the breakdown threshold results in the formation of a pixel-less structure (having color centers), compaction of the substrate material, increase in the index of refraction, and formation of a "valley" on the substrate surface. Compaction of the substrate material produces a positive phase change, while formation of the valley produces a negative phase change. For some substrates, such as substrates made of fused silica, the overall effect from the compaction of the substrate material and the formation of the valley results in a net positive phase change.

Figure 16:
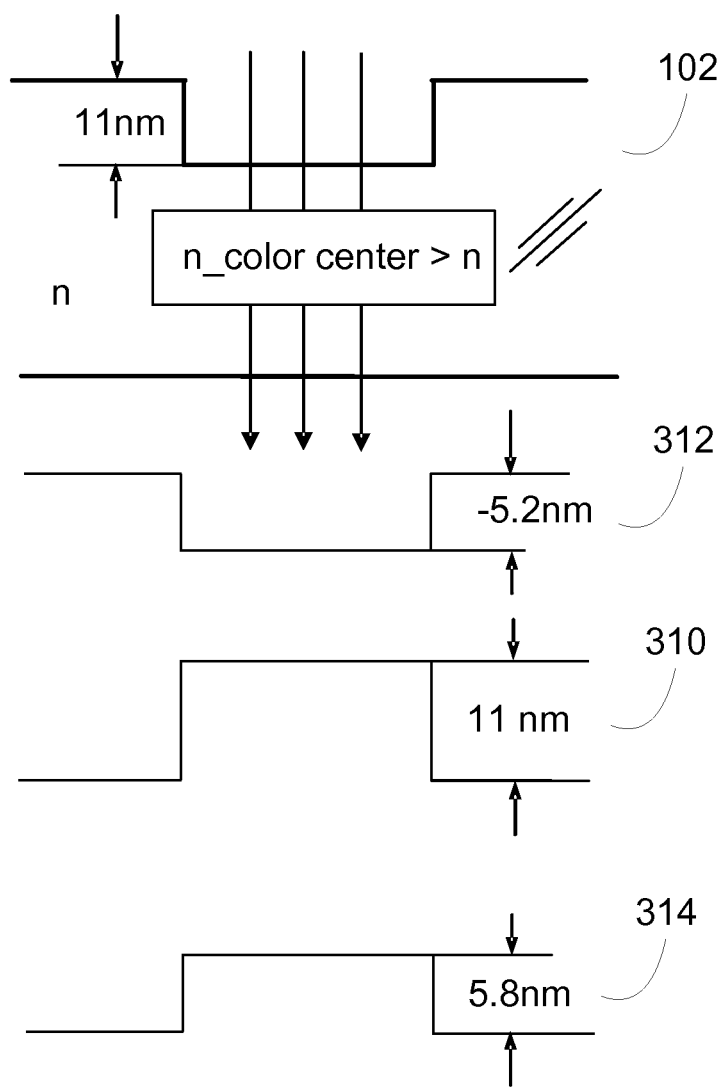
FIG. 16 is a diagram showing the effects of compaction of the substrate material, increase in the index of refraction, and formation of a valley on the substrate surface.

FIG. 16 is a diagram showing the effects of compaction of the substrate material, increase in the index of refraction, and formation of a valley on the substrate surface. In this example, the increase in the index of refraction products a positive 11 nm phase change (310), whereas the formation of the valley produces a negative 5.2 nm phase change (312). Here, the depth of the valley is about 11 nm, and the refractive index of the substrate is about 1.47, so the phase change is 11 nm*(1−1.47)=−5.2 nm. The overall effect from the compaction of the substrate material and formation of the valley results in a net positive phase change of 11 nm−5.2 nm=5.8 nm (314).

FIGS. 8 and 10 show examples in which color centers are written into cells 182 and 222, and the properties of color centers within each cell are uniform. In other examples, the color centers can be written in any region across the entire substrate 102, and any two adjacent cells containing color centers can have different properties (e.g., different transmittance profiles).

The storage device of the computer 104 may store a database having data indicating what parameters for the laser pulses should be used when generating color centers in order to achieve a certain amount of attenuation or phase compensation. The parameters can include, for example, energy level, pulse duration, repetition rate, pitch, numerical aperture, and distance of focal point from the substrate surface. The database can have information for substrates made of different materials, or substrates of different model numbers, such that when a new substrate is loaded onto the stage 120, the computer 104 can search the database and upload relevant parameter values suitable for the new substrate. The storage device may store instructions that, when executed by the computer 102, cause the computer 102 to control the parameters of the laser pulses, the scanning of the laser pulses, the movement of the stage 120, the temperature and duration of the thermal treatment and DUV treatment, according to predetermined parameter values.

A calibration procedure may be performed in which color centers are written in un-used areas of the substrate, and properties of the color centers are measured to determine whether they match desired properties (such as target attenuation levels). The laser energy, pulse width, repetition rate, and/or pitch can be adjusted during calibration, and the calibrated parameters are used for generating the color centers in active areas (e.g., areas that have circuit patterns) of the substrate.

In some implementations, both the transmission profile and the phase compensation across the substrate can be controlled by writing color centers into the substrate. When color centers are written at different depths, the amount of surface deformation may be different. When the color center is located farther away from the surface, the amount of surface deformation decreases. The amount of phase change due to the change in the index of refraction remains the same, but the amount of phase change due to surface deformation is reduced. Thus, it is possible to achieve a desired amount of DUV attenuation, while varying the amount of phase compensation (within a certain range) by focusing the laser pulses at different depths to form the color centers at different depths. This way, both the transmission and phase compensation across the substrate can be controlled (within a certain range).

The features described above related to processing of data (for example, converting a transmission correction map or phase error map to a laser writing map) can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and single processor or multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) monitor or a flat panel display, e.g., LCD (liquid crystal display) for displaying information to the user and a keyboard and a pointing device such as a mouse, a trackball, or a touch surface (e.g., touch screen or touch pad) by which the user can provide input to the computer.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

The substrate 102 can be made of a material different from those described above. The properties of the laser pulses, such as energy, pulse width, repetition rate, and pitch, can be different from those described above. The computer 104 can be a programmable microcontroller. The transparent substrate can be partially transparent with respect to relevant radiation (e.g., the radiation used to generate pixels or color centers in the substrate, or the radiation used to cure the material to stabilize the transmission spectrum of the material). The substrate 102 can be any solid transparent medium. Accordingly, other implementations are within the scope of the following claims.

What is claimed is:

1. A method for processing a substrate, comprising:
modifying a transmittance profile of a substrate with respect to a first radiation by focusing light pulses at various regions in the substrate to form color centers in the substrate, the regions being located inside the substrate and at a distance from a surface of the substrate, each of the light pulses having an energy level less than a breakdown threshold of a material of the substrate, the color centers enhancing absorption of the first radiation; and
curing the substrate to stabilize a transmittance spectrum of the substrate.

2. The method of claim 1 in which curing the substrate comprises irradiating the substrate with deep ultraviolet radiation.

3. The method of claim 2 in which irradiating the substrate with deep ultraviolet radiation comprises irradiating the substrate with deep ultraviolet radiation having a wavelength in a range between 150 nm to 300 nm.

4. The method of claim 2 in which curing the substrate comprises heating the substrate in addition to irradiating the substrate with deep ultraviolet radiation.

5. The method of claim 1 in which curing the substrate comprises heating the substrate.

6. The method of claim 5 in which heating the substrate comprises heating the substrate at a temperature of at least 80° C. for a period of at least 0.1 hour.

7. The method of claim 4 in which heating the substrate comprises local heating by focused electromagnetic radiation, the electromagnetic radiation having a wavelength selected such that the substrate is not fully transparent to the electromagnetic radiation and absorbs a portion of the electromagnetic radiation.

8. The method of claim 1 in which the light pulses comprise ultra-short laser pulses having a pulse width in a range from 10 femtoseconds to 100 picoseconds.

9. The method of claim 1 in which modifying a transmittance profile of a substrate comprises modifying a transmittance profile of a substrate comprising fused silica.

10. The method of claim 1 in which the substrate comprises at least one of a photo mask, lens, or optical plate.

11. The method of claim 1 in which the focused light pulses overlap such that the color centers overlap and form a continuous layer in the substrate.

12. The method of claim 1 in which the first radiation comprises ultraviolet light.

13. The method of claim 1 in which the substrate comprises a photo mask having patterns designed to be illuminated by the first radiation to transfer the patterns to a wafer.

14. A method for processing a substrate, comprising:
modifying a transmittance profile of a photo mask with respect to first ultraviolet light by focusing light pulses at various regions in the photo mask to form color centers in the photo mask, the regions being located inside the photo mask and at a distance from a surface of the photo mask, each of the light pulses having an energy level less than a breakdown threshold of a material of the photo mask, the color centers enhancing absorption of the first ultraviolet light;
after formation of the color centers, irradiating the photo mask with second ultraviolet light to stabilize a transmittance spectrum of the photo mask; and
heating the photo mask to stabilize the transmittance spectrum of the photo mask.

15. The method of claim 14 in which heating the photo mask comprises heating the photo mask at a temperature of at least 80° C. for a period of at least 0.1 hour.

16. The method of claim 14 in which irradiating the photo mask with second ultraviolet light to stabilize a transmittance spectrum comprises irradiating the photo mask with deep ultraviolet radiation having a wavelength in a range from 150 nm to 300 nm.

17. The method of claim 14 in which the light pulses comprise laser pulses having pulse widths ranging from 10 femtoseconds to 100 picoseconds.

18. The method of claim 14 in which the focused light pulses overlap such that the color centers form a continuous layer in the photo mask.

19. The method of claim 18 in which the continuous layer has a thickness less than 50 μm.

20. The method of claim 14 in which the first ultraviolet light comprises deep ultraviolet light having a wavelength less than 300 nm.

21. A method for modifying transmittance of a transparent medium, comprising: identifying a phase error map for a transparent medium that specifies phase errors at various locations across the transparent medium; and
modifying a transmission phase profile of the transparent medium according to the phase error map by focusing light pulses at various regions in the transparent medium to form regions having modified indices of refraction with respect to a first radiation,
the light pulses also modifying a density of the transparent medium at the regions to modify a surface height profile of the transparent medium, the light pulses being controlled such that a combination of the modification of refraction indices and the modification of the surface height profile compensate the phase errors specified by the phase error map.

22. The method of claim 21 in which each of some of the light pulses has an energy level below a breakdown threshold of a material of the transparent medium, and regions having modified indices of refraction comprise color centers.

23. The method of claim 21 in which the light pulses comprise ultra-short laser pulses having pulse widths ranging from 10 femtoseconds to 100 picoseconds.

24. The method of claim 21 in which modifying a density of the transparent medium comprises increasing a density of the transparent medium increases at a region to form a valley on a surface of the transparent medium.

25. The method of claim 21 in which each of some of the light pulses has an energy level above a breakdown threshold of a material of the transparent medium.

26. The method of claim 21 in which modifying a density of the transparent medium comprises decreasing a density of the transparent medium at a region to form a bump on a surface of the transparent medium.

* * * * *